(12) United States Patent
Bruno

(10) Patent No.: US 6,377,090 B1
(45) Date of Patent: Apr. 23, 2002

(54) POWER-ON-RESET CIRCUIT (75) Inventor: Gailhard Bruno, Trets (FR)

(73) Assignee: STMicroelectronics, S.A., Crolles (FR)

( * ) Notice: Subject to any disclaimer, the term of this patent is extended or adjusted under 35 U.S.C. 154(b) by 0 days.

(21) Appl. No.: 09/644,028

(22) Filed: Aug. 22, 2000

(30) Foreign Application Priority Data

Aug. 31, 1999 (FR) .............................. 99 11138

(51) Int. Cl.[7] .............................. H03K 7/22; G05F 1/46
(52) U.S. Cl. ...................... 327/143; 327/539; 323/313; 323/315
(58) Field of Search ................................ 327/142, 143, 327/198, 539, 540, 541, 543; 323/313, 314, 315; 365/189.09, 226

(56) References Cited

U.S. PATENT DOCUMENTS

| | | | |
|---|---|---|---|
| 4,978,905 A | 12/1990 | Hoff et al. ................... 323/314 |
| 5,103,115 A | 4/1992 | Ueda et al. .................. 327/143 |
| 5,302,861 A | * 4/1994 | Jelinek ........................ 327/143 |
| 5,774,013 A | * 6/1998 | Groe .......................... 327/543 |
| 5,852,376 A | 12/1998 | Kraus .......................... 327/143 |
| 5,929,672 A | 7/1999 | Mitani ......................... 327/143 |
| 5,936,443 A | 8/1999 | Yasuda et al. ............... 327/143 |
| 6,137,324 A | * 10/2000 | Chung ......................... 327/143 |

FOREIGN PATENT DOCUMENTS

FR    2 757 713    12/1996    ......... H03K/17/296

* cited by examiner

*Primary Examiner*—Terry Cunningham
*Assistant Examiner*—Terry L. Englund (57) ABSTRACT

A power-on-reset circuit for delivering a power-on-reset pulse when a supply voltage ramps up from zero to a predetermined voltage includes a pull-down circuit portion for connecting an output node of the power-on-reset circuit to ground when the supply voltage reaches a predetermined upper threshold voltage and a pull-up circuit portion for connecting the output node to the supply voltage when the supply voltage reaches a predetermined upper threshold voltage. The pull-up circuit portion includes a transistor whose gate is polarized by a reference voltage taken at the terminals of a precision resistance traversed by a current delivered by a current generator, where the current is preferably a band-gap current proportional to the temperature of the circuit. The power-on-reset circuit is particularly suitable for microprocessors.

13 Claims, 4 Drawing Sheets

POWER-ON-RESET CIRCUIT

BACKGROUND OF THE INVENTION

1. Technical Field

The present invention relates to a circuit for resetting when a supply voltage appears, generally called "Power-On-Reset" circuit or "POR" circuit in the Anglo-Saxon terminology.

2. Description of the Related Art

When powered on, most of the programmed or programmable type logic circuits, in particular microprocessors, must be set in a zero state or RESET state in order to assure that their constitutive elements do not present undetermined logic states. The POR circuits, provided for this, deliver a RESET signal when the supply voltage rises and reaches a first switching threshold $V_{th1}$, and release the RESET signal when the voltage reaches a second switching threshold $V_{th2}$. According to the chosen convention, the active value of the RESET signal may be 1 or 0. The release of the RESET signal corresponds to its setting to 0 in the first case and to its setting to 1 in the second case.

A difficulty in the design of a POR circuit, in particular in CMOS technology, is to obtain a release threshold $V_{th2}$ of the RESET signal which is constant and little sensitive to the sizes of the MOS transistors, in particular the ratio W/L between the width W and the length L of the gate of the transistors. This ratio is indeed likely to vary unintentionally, from a circuit to another, because of tolerances of the manufacturing method.

Another difficulty is to obtain a release threshold $V_{th2}$ of the RESET signal which is little sensitive to the temperature of the circuit.

Figure 1:
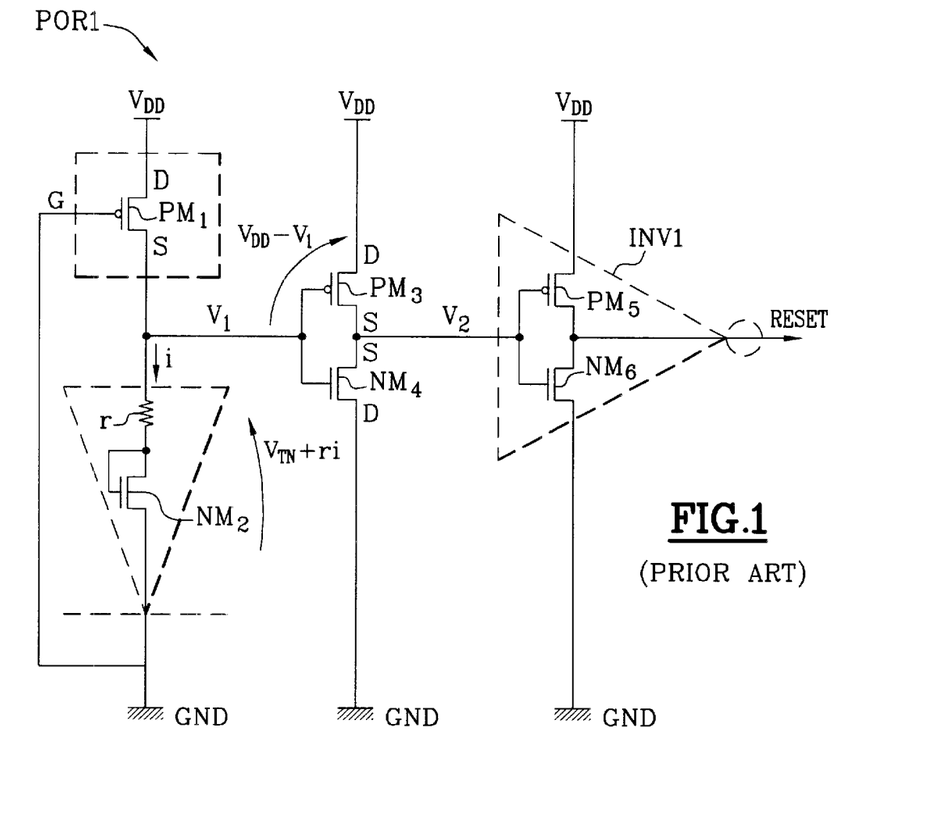
FIG. 1 previously described, depicts the electrical diagram of a conventional circuit POR1.

FIG. 1 shows the electrical diagram of a conventional circuit POR1 supplied by a voltage $V_{DD}$. In this diagram, the references of the PMOS transistors begin with a letter "P" and the references of the NMOS transistors begin with a letter "N". The NMOS transistors have a threshold voltage $V_{TN}$ and the PMOS transistors have a threshold voltage $V_{TP}$.

The circuit POR1 comprises a polarisation stage comprising, arranged in series, a ballast transistor $PM_1$ (comparable to a resistance) and a diode transistor $NM_2$, transistor $PM_1$ having its gate connected to ground and transistor $NM_2$ having its gate fed back to its drain. The mid-point of the transistors $PM_1$, $NM_2$ delivers a voltage $V_1$ applied to the gates of two other transistors $PM_3$, $NM_4$ arranged in series, forming a switching stage. The mid-point of transistors $PM_3$, $NM_4$ delivers an output voltage $V_2$ of the circuit POR1. The active state of the RESET signal being here by convention a logical "1", the output voltage $V_2$ is applied to the input of an inverting gate INV1 formed by two other transistors $PM_5$, $NM_6$, whose output delivers the RESET signal.

When the voltage $V_{DD}$ appears, the voltage $V_1$ copies the voltage $V_{DD}$ as long as the diode transistor $NM_2$ is OFF. The first switching threshold $V_{th1}$ is reached when the voltage $V_{DD}$ becomes equal to the threshold voltage $V_{TN}$. The diode transistor $NM_2$ and the transistor $NM_4$ turn ON, the voltage $V_2$ passes to 0 (ground GND) and the RESET signal passes to 1.

The second switching threshold $V_{th2}$, or release threshold of the RESET signal, is reached by the voltage $V_{DD}$ when the source-gate voltage $V_{SG}$ of transistor $PM_3$ becomes equal to its threshold voltage $V_{TP}$, the transistor $PM_3$ turning ON. The voltage V1 at the terminals of the diode transistor $NM_2$ being at this moment equal to:

$$V_1 = V_{TN} + ri \quad (1)$$

r being the series resistance of transistor $NM_2$ and i the current passing through it, the switching threshold $V_{th2}$ is thus equal to:

$$V_{DD} = V_{th2} = V_{TP} + V_1 = V_{TP} + V_{TN} + ri \quad (2)$$

Figure 2:
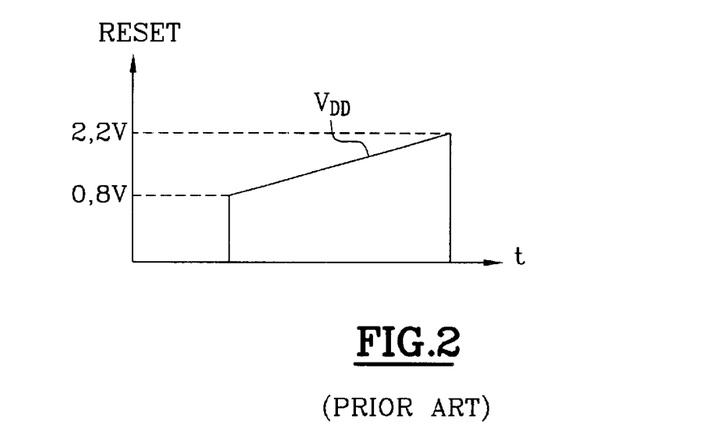
FIG. 2 previously described, depicts the conventional is form of a resetting signal RESET.

In practice, the threshold voltages $V_{TN}$ and $V_{TP}$ are in the order of 0.8 V, and the voltage ri is in the order of 0.6 V. The switching threshold $V_{th1}$ is thus in the order of 0.8 V and the switching threshold $V_{th2}$ is in the order of 2,2 V at ambient temperature. As it can be seen in FIG. 2, the voltage of 0.8 V corresponds to a logic "1" of the RESET signal at a moment when this signal is set to 1 and the voltage of 2,2 V corresponds to a logic "1" of the RESET signal at a moment when it is brought back to 0 by the turning ON of transistor $PM_3$.

The relation (2) shows that the switching threshold $V_{th2}$ depends on the threshold voltages $V_{TN}$ and $V_{TP}$, as well as on the resistance r of the diode transistor $NM_2$ and the current i flowing through the polarization stage. However, the threshold voltages $V_{TP}$ or $V_{TN}$ of MOS transistors are sensitive to temperature and increase when temperature decreases. Also, the resistance r of diode transistor $NM_2$ depends on the ratio W/L of the gate of transistor $NM_2$ and the current i depends on the ratio W/L of the gate of the ballast transistor $PM_1$, which determines the electric resistance of this transistor.

The switching threshold $V_{th2}$ is thus sensitive to the ratio W/L of the gates of the switching stage transistors and to the temperature of the circuit.

The present invention is directed to overcome this drawback.

SUMMARY OF THE INVENTION

More particularly, a first object of the present invention is to provide a POR circuit which presents a switching threshold $V_{th2}$ not much sensitive to the ratio W/L of the gates of the MOS transistors.

A second object of the present invention is to provide a POR circuit which presents a switching threshold $V_{th2}$ not much sensitive to variations of temperature.

The foregoing objects are achieved as is now described. To that effect, the present invention provides a circuit for delivering a logic signal at the appearance of a supply voltage, comprising means for connecting an output node of the circuit to ground when the supply voltage reaches a first switching threshold, and means for connecting the output node to the supply voltage when the supply voltage reaches a second switching threshold, wherein the means for connecting the output node to the supply voltage comprise a switching transistor whose gate is polarized by a reference voltage taken at the terminals of a first precision resistance traversed by a current delivered by a current generator.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

According to one embodiment, the current generator delivers a current varying proportionally to temperature according to a law which is inverse of the variation law according to temperature of the threshold voltage of the switching transistor.

According to one embodiment, the switching transistor is a PMOS transistor.

According to one embodiment, the means for connecting the output node to the supply voltage comprise two transistors arranged in series receiving the reference voltage on their gates.

According to one embodiment, the means for connecting the output node to the supply voltage comprises a diode transistor arranged in series with the switching transistor.

According to one embodiment, the current generator comprises a first branch comprising a first diode, a second branch comprising a second diode arranged in series with a second precision resistance, a third branch comprising the first precision resistance, transistors arranged so that the three branches are traversed by an identical current, and transistors arranged so that the voltage appearing at the terminals of the group formed by the second precision resistance and the second diode is equal to the voltage appearing at the terminals of the first diode.

According to one embodiment, the means for connecting the output node to ground comprises a transistor whose gate is polarized by a diode voltage delivered by a polarization stage comprising, arranged in series, a ballast transistor, a switch transistor whose gate is polarized by the supply voltage, and a diode transistor, the diode voltage being taken between the ballast transistor and the switch transistor.

According to one embodiment, the circuit comprises an output inverting gate for inverting the output signal of the switching stage.

The present invention also relates to an integrated circuit, in particular a microprocessor, comprising a circuit of the above described type for delivering a resetting signal at its power-on.

Figure 3:
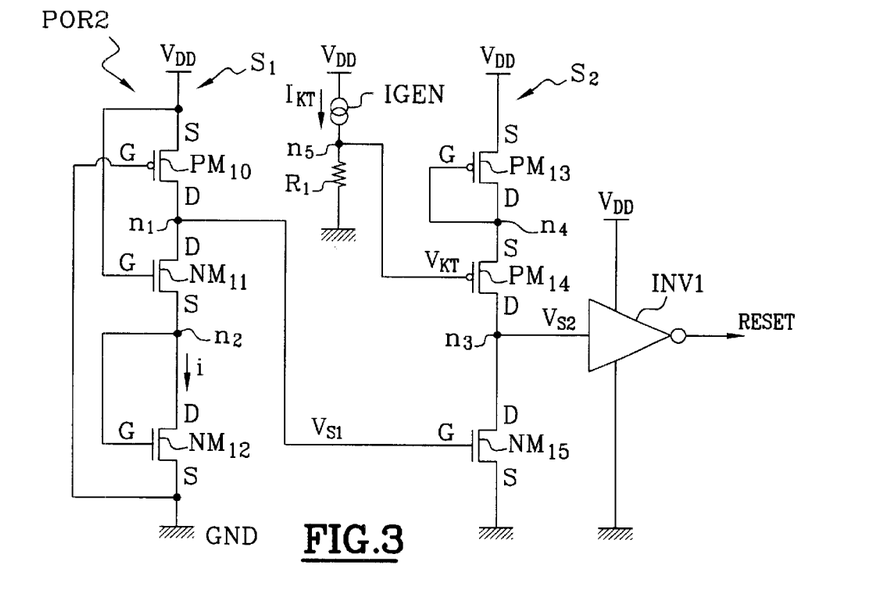
FIG. 3 depicts the electrical diagram of a circuit POR2 according to the invention, supplied by a voltage $V_{DD}$ and arranged to deliver a resetting signal RESET at its power-on, in accordance with a preferred embodiment of the present invention.

With reference now to the figures, and in particular with reference to FIG. 3 the circuit POR2 comprises a polarization stage S1 and a switching stage S2 The polarization stage S1 delivers a voltage $V_{S1}$ applied to the switching stage S2 The switching stage S2 delivers an output voltage $V_{S2}$ which may be used as the RESET signal or may be applied to the input of a gate INV1 whose output delivers the RESET signal, as shown in FIG. 3.

The polarization stage S1 comprises a ballast transistor $PM_{10}$, a switch transistor $NM_{11}$ and a diode transistor $NM_{12}$. The switching stage S2 comprises a diode transistor $PM_{13}$, a switch transistor $PM_{14}$ and a transistor $NM_{15}$. The connections between these elements are described in table 1, last page of the description, in reference to various interconnection nodes n1 to n5 shown in FIG. 3.

In a per se conventional manner, transistor $NM_{15}$ ensures the passage to 0 (GND) of the output voltage $V_{S2}$, and transistor $PM_{14}$ ensures the passage to 1 ($V_{DD}$) of the voltage $V_{S2}$, when transistor $PM_{13}$ is ON. To avoid short-circuits between the voltage $V_{DD}$ and the ground GND, the ratio W/L (width over length) of the gate of transistor $NM_{15}$ is chosen small enough in order that transistor $NM_{15}$ presents a high serial resistance. Furthermore, the gates of the transistors $NM_{11}$, $PM_{13}$ and $PM_{14}$ present a significant W/L ratio to achieve a small serial resistance.

According to the invention, the voltage $V_{S1}$ delivered by the polarization stage S1 is not used for polarizing the gate of transistor $PM_{14}$ and is only applied to the gate of transistor $NM_{15}$. The gate of transistor $PM_{14}$ is polarized by a reference voltage $V_{KT}$ taken at the terminals of a precision resistance R1, for example a resistance made of polysilicon or doped single crystal silicon, traversed by a current $I_{KT}$ delivered by a current generator IGEN.

Thus, transistor $PM_{14}$ is ON when its source-drain voltage $V_{SD}$ is above or equal to the sum of its threshold voltage $V_{TP}$ and of voltage $V_{KT}$. The diode transistor $PM_{13}$ is ON when its source-drain voltage $V_{SD}$ is above or equal to its threshold voltage $V_{TP}$.

Figure 4A:
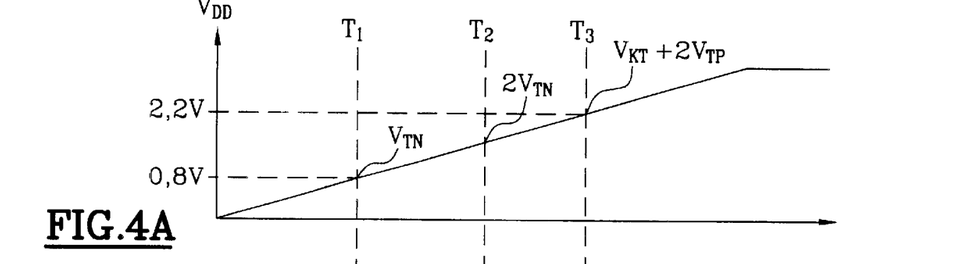
FIGS. 4A to 4D illustrate the operation of the circuit POR2 and show electric signals appearing at the power-on of the circuit, in accordance with a preferred embodiment of the present invention.
Figure 4B:
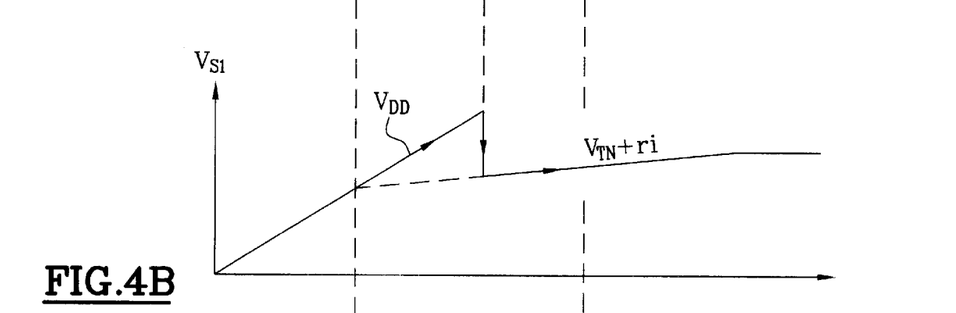
Figure 4C:
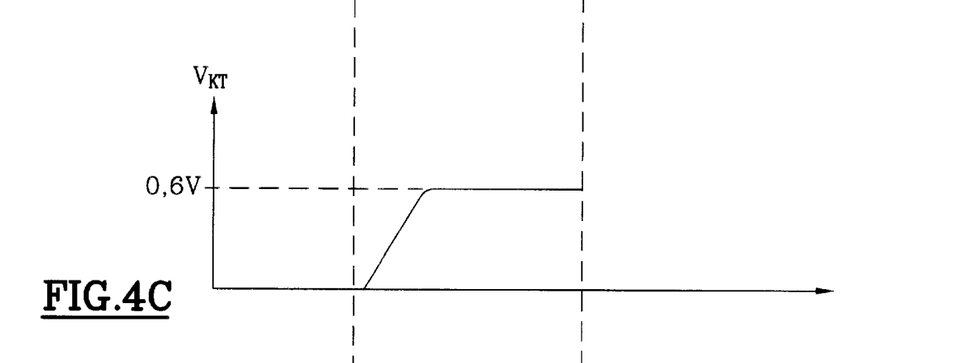
Figure 4D:
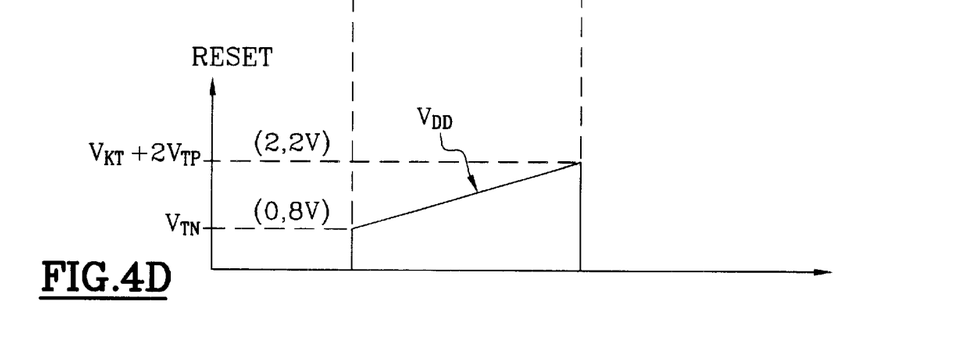

FIGS. 4A to 4D illustrate the operation of the circuit POR2. FIG. 4A shows the aspect of the supply voltage $V_{DD}$ at power-on, substantially in the form of a ramp. FIG. 4B shows the aspect of the voltage $V_{S1}$. FIG. 4C shows the aspect of the reference voltage $V_{KT}$ and FIG. 4D shows the RESET signal. As a numerical example, it will be considered that the threshold voltages $V_{TP}$ and $V_{TN}$ of the NMOS and PMOS transistors are identical and equal to 0.8 V, and that the reference voltage $V_{KT}$ is equal to 0.6 V.

At power-on, the voltage $V_{S1}$ copies the voltage $V_{DD}$ as long as said voltage is not equal to $2V_{TN}$. At a moment T1, the voltage $V_{S1}$ reaches a first switching threshold $V_{th1}$ equal to $$V_{th1} = V_{TN} \tag{3}$$

Transistor $NM_{15}$ turns ON, the output voltage $V_{S2}$ passes to 0 and the RESET signal passes to 1, the logic "1" being equal to the voltage $V_{DD}$, that is 0.8 V at this moment. The first switching threshold $V_{th1}$ of the circuit POR2 is thus equal to the one of the conventional circuit POR1 described in the preamble.

At a moment T2, the voltage $V_{S1}$ is equal to $2V_{TN}$. The switch transistor $NM_{11}$ closes and the diode transistor $NM_{12}$ turns ON. Transistor $NM_{11}$ presenting a small serial resistance, the voltage $V_{S1}$ drops abruptly, following the conventional relation:

$$V_{S1} = V_{TN} + ri \tag{4}$$

This relation is identical to the relation (1) described in the preamble, r being the serial resistance of the diode transistor $NM_{12}$ and i the current flowing through. It will thus be appreciated that the providing of the switch transistor $NM_{11}$ in the polarization stage S1 is an optional characteristic allowing the achievement of a more abrupt slope of the voltage $V_{S1}$ near the voltage $V_{TN}$, for a more distinct switching of the transistor $NM_{15}$. The drop of the voltage $V_{S1}$ which then occurs, due to the small serial resistance of transistor $NM_{11}$, allows the limitation of the current consumption in the transistor $NM_{15}$.

At a moment T3, the supply voltage $V_{DD}$ reaches a second switching threshold $V_{th2}$ equal to:

$$V_{th2}=2V_{TP}+V_{KT} \qquad (5)$$

The transistors $PM_{13}$ and $PM_{14}$ turn ON and the output voltage $V_{s2}$ becomes equal to the voltage $V_{DD}$, for example 2.2 V. The RESET signal passes to 0 at the output of the gate INV1, as it can be seen in FIG. 4D.

The relation (5) shows that the switching threshold $V_{th2}$ of the circuit POR2 according to the invention only depends on the threshold voltage $V_{TP}$ of the transistors $PM_{13}$ and $PM_{14}$ and on the reference voltage $V_{KT}$. The latter appears progressively between the moment T1 and the moment T2, as it can be seen in FIG. 4C, and stabilizes before the moment T3 at its reference value, for example 0.6 V.

In other terms, the threshold $V_{th2}$ is independent of the voltage $V_{S1}$ and of the W/L ratio of the gates of the transistors of the polarization stage S1. The first object of the invention is thus achieved.

The second object of the invention, which relates to the stability in temperature of the switching threshold $V_{th2}$, is achieved by the providing of a current generator IGEN delivering a current called "band-gap" current following a relation of the type:

$$I_{KT}=KT \qquad (6)$$

T being the temperature of the circuit and K a constant. The resistance R1 and the constant K are chosen so that the increase of the threshold voltages $V_{TP}$ due to the decrease of the temperature T is greatly compensated by a corresponding decrease of the reference voltage $V_{KT}$, so that the switching threshold $V_{th2}$ is substantially constant whatever the temperature of the circuit may be.

Figure 5:
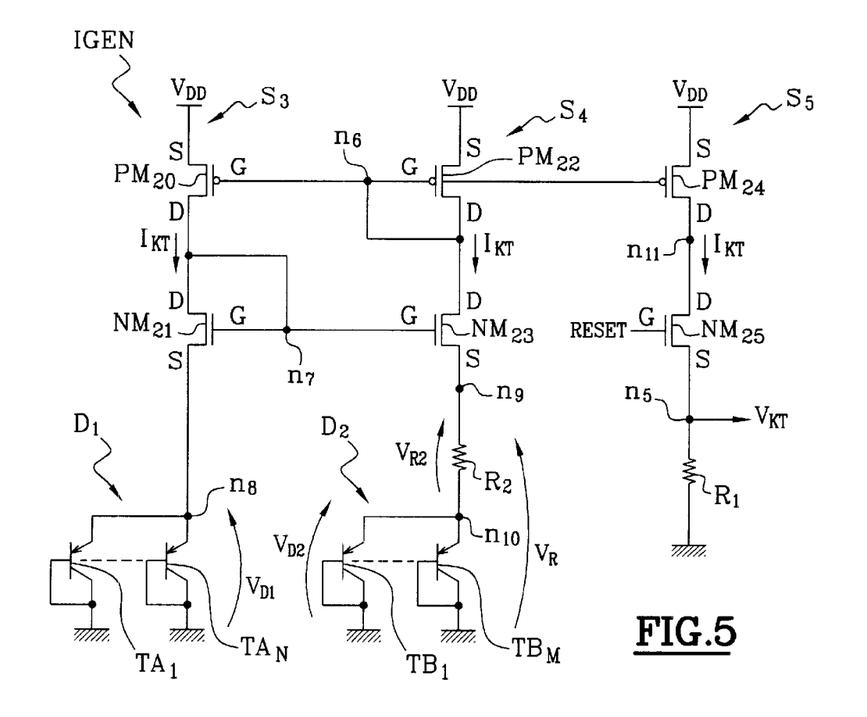
FIG. 5 shows the electrical diagram of an element of the circuit POR2, in accordance with a preferred embodiment of the present invention.

FIG. 5 shows an embodiment of the generator IGEN, comprising three branches S3, S4, S5 supplied by the voltage $V_{DD}$. The branch S3 comprises, arranged in series, a transistor $PM_{20}$, a transistor $NM_{21}$ and a diode D1 at whose terminals a voltage $V_{D1}$ appears. The diode D1 is formed by N parallel PNP transistors having the reference $TA_i$, i ranging from 1 to N, arranged in diodes (having their base connected to their collector). The branch S4 comprises, arranged in series, a transistor $PM_{22}$, a transistor $NM_{23}$, a precision resistance R2 at whose terminals a voltage $V_{R2}$ appears, and a diode D2 at whose terminals a voltage $V_{D2}$ appears. The diode D2 is formed by M parallel PNP transistors having the reference $TB_i$, i ranging from 1 to M, arranged in diodes. The branch S5 comprises, arranged in series, a transistor $PM_{24}$, a transistor $NM_{25}$ driven by the RESET signal, and the precision resistance R1, already mentioned. The connections between these elements are described in table 2, last page of the description, with reference to the interconnection nodes n5 to n11 shown in FIG. 5.

The generator IGEN operates as follows. The transistors $PM_{20}$, $PM_{22}$, $PM_{24}$ are arranged in current mirrors and the three branches S3, S4, S5 are traversed by the same current $I_{KT}$. The transistors $NM_{21}$ and $NM_{23}$ have their gates connected together and provide the equality of voltage $V_{D1}$ and voltage $V_R$ at the terminals of resistance R2 and diode D2, so that:

$$V_{D1}-V_{D2}=V_R-V_{D2}=(V_{D2}+V_{R2})-V_{D2}=V_{R2} \qquad (7)$$

The current $I_{KT}$ being identical in the diodes D1 and D2, it follows that:

$$I_{KT}=N\,I_{D1i}=M\,I_{D2i} \qquad (8)$$

$I_{D1i}$ and $I_{D2i}$ being the currents flowing through each of the N and M elementary diodes forming the diodes D1 and D2.

The current flowing through a diode being given by the general relation:

$$I=Is\,\exp.\,(q\,V//kT) \qquad (9)$$

the following equality is deduced:

$$I_{KT}=N\,Is\,\exp.\,(q\,V_{D1}/kT)=M\,Is\,\exp.\,(q\,V_{D2}/kT) \qquad (10)$$

from where it results that:

$$V_{D1}-V_{D2}=(kT/q)\ln(M/N) \qquad (11)$$

The combination of the relations (7) and (11) gives the current $I_{KT}$ and the voltage $V_{KT}$ as a function of the resistance R2:

$$I_{KT}=(1/R2)(kT/q)\ln(M/N) \qquad (12)$$

$$V_{KT}=(R1/R2)(kT/q)\ln(M/N) \qquad (13)$$

The constant K mentioned above is thus equal to:

$$K=(1/R2)(k/q)\ln(M/N) \qquad (14)$$

and may be adjusted by means of the parameters N, M and resistance R2.

In FIG. 5, the transistor $NM_{25}$ is an optional element of the generator IGEN and allows, after the passage of the second threshold $V_{th2}$, the forcing to zero of the voltage $V_{KT}$ and the locking of the RESET signal.

Figure 6:
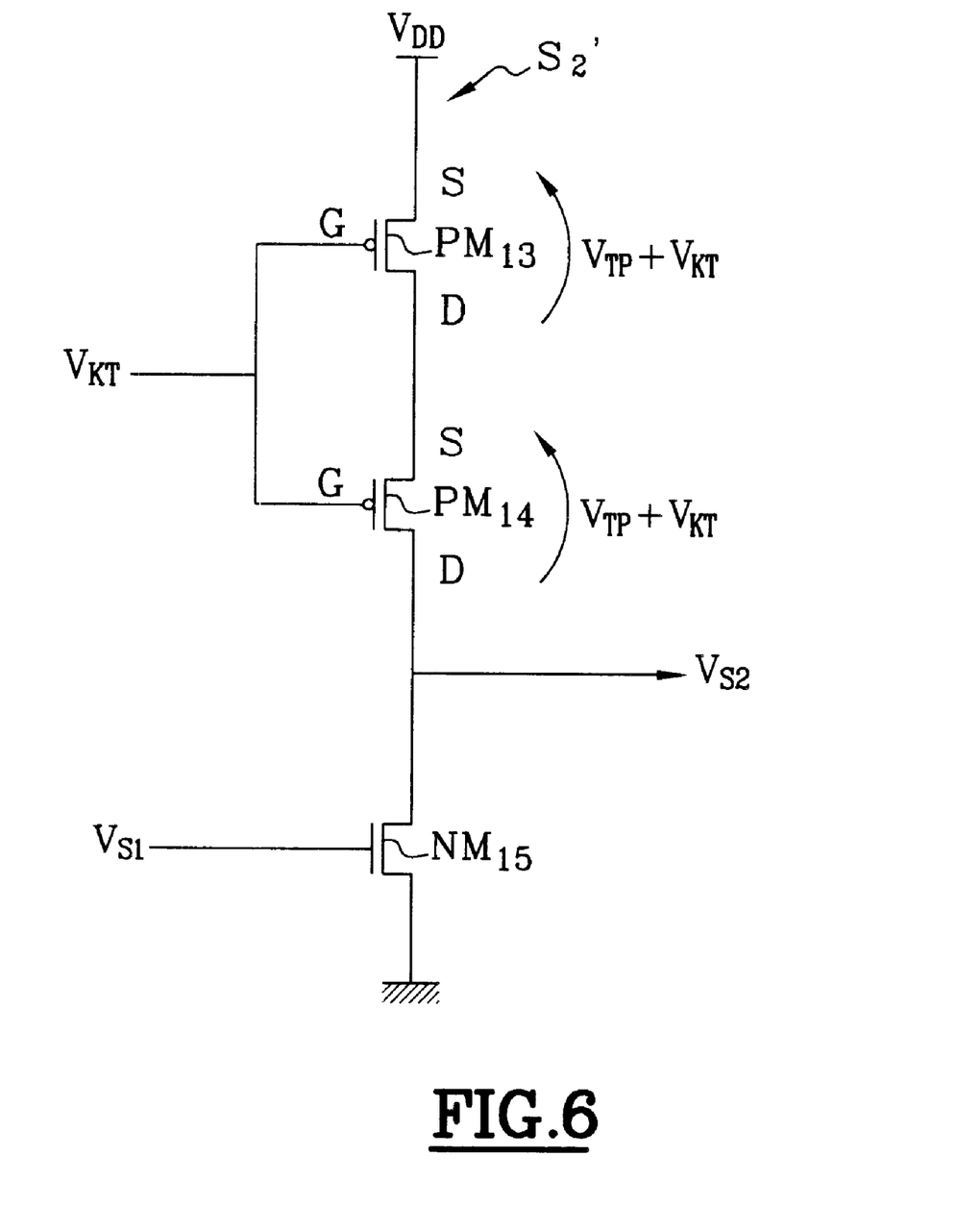
FIG. 6 shows an alternative embodiment of a switching stage of the circuit POR2.

It will be readily apparent to the person skilled in the art that the circuit POR2 according to the invention is likely to have various alternatives and embodiments, in particular regarding the generator IGEN and the design of the switching stage S2 As an example, FIG. 6 shows an embodiment S2' of the switching stage where the gates of the transistors $PM_{13}$ and $PM_{14}$ are both biased by the reference voltage $V_{KT}$, the switching threshold $V_{th2}$ being in this case equal to:

$$V_{th2}=2(V_{TP}+V_{KT}) \qquad (15)$$

each transistor $PM_{13}$, $PM_{14}$ having to receive, between its source and its drain, a voltage equal to $(V_{TP}+V_{KT})$ for switching from the state OFF to the state ON.

TABLE 1 structure of the circuit POR2

| Transistors | Gate (G) | Drain (D) | Source (S) |
| --- | --- | --- | --- |
| $PM_{10}$ | ground (GNL) | node n1 | voltage $V_{DD}$ |
| $NM_{11}$ | voltage $V_{DD}$ | node n1 | node n2 |
| $NM_{12}$ | node n2 | node n2 | ground (GND) |
| $PM_{13}$ | node n4 | node n4 | voltage $V_{DD}$ |
| $PM_{14}$ | node n5 | node n3 | node n4 |
| $NM_{15}$ | node n1 (voltage $V_{S1}$) | node n3 (voltage $V_{S2}$) | node GND |
| Other elements | Input | Output | Supply voltage |

TABLE 1-continued structure of the circuit POR2

| | | | |
|---|---|---|---|
| gate INV1 | node n3 (voltage $V_{S2}$) | delivers the signal RESET | $V_{DD}$ |
| generator IGEN | $V_{DD}$ | node n5 (delivers $I_{KT}$) | $V_{DD}$ |
| resistance R1 | node n5 (delivers $V_{KT}$) | ground (GND) | $I_{KT}$ |

TABLE 2 structure of the generator IGEN

| MOS transistors | Gate (G) | Drain (D) | Source (S) |
|---|---|---|---|
| $PM_{20}$ | n6 | n7 | $V_{DD}$ |
| $NM_{21}$ | n7 | n7 | n8 |
| $PM_{22}$ | n6 | n6 | VDD |
| $NM_{23}$ | n7 | n6 | n9 |
| $PM_{24}$ | n6 | n11 | $V_{DD}$ |
| $NM_{25}$ | receives the signal RESET | n11 | n5 |
| PNP Transistors | Base | Emitter | Collector |
| $TA_i$ (i = 1 to N) | ground (GND) | n8 | GND |
| $TB_i$ (i = 1 to M) | ground (GND) | n10 | GND |
| Resistances | input | output | |
| Resistance R1 | n5 (delivers $V_{KT}$) | ground (GND) | |
| Resistance R2 | n9 | n10 | |

It is important to note that while the present invention has been described in the context of a fully functional data processing system and/or network, those skilled in the art will appreciate that the mechanism of the present invention is capable of being distributed in the form of a computer usable medium of instructions in a variety of forms, and that the present invention applies equally regardless of the particular type of signal bearing medium used to actually carry out the distribution. Examples of computer usable mediums include: nonvolatile, hard-coded type mediums such as read only memories (ROMs) or erasable, electrically programmable read only memories (EEPROMs), recordable type mediums such as floppy disks, hard disk drives and CD-ROMs, and transmission type mediums such as digital and analog communication links.

While the invention has been particularly shown and described with reference to a preferred embodiment, it will be understood by those skilled in the art that various changes in form and detail may be made therein without departing from the spirit and scope of the invention.

What is claimed is:

1. Power-on-reset circuit for generating a power-on-reset pulse when a supply voltage applied to said power-on-reset circuit ramps up from zero to a predetermined voltage, comprising:

a biasing stage delivering a biasing signal equal or proportional to the supply voltage;

pull-down means driven by the biasing signal for connecting an output node of the power-on-reset circuit to ground when the supply voltage reaches a predetermined lower threshold voltage; and pull-up means not driven by the biasing signal for connecting said output node to the supply voltage when the supply voltage reaches a predetermined upper threshold voltage, wherein the pull-up means comprises at least a switching transistor whose gate is polarized by a reference voltage, said reference voltage equal to a voltage across terminals of a first precision resistance traversed by a current delivered by a current generator, said reference voltage being independent of said biasing signal, and said reference voltage being independent of the supply voltage at the latest when the supply voltage reaches said predetermined upper threshold voltage.

2. Power-on-reset circuit according to claim 1, wherein the current delivered by the current generator varies proportionally to temperature according to a law which is inverse of a variation law according to temperature of a threshold voltage of the switching transistor.

3. Power-on-reset circuit according to claim 1, wherein the switching transistor is a PMOS transistor.

4. Power-on-reset circuit according to claim 1, wherein the pull-up means comprises two switching transistors arranged in series, both receiving the reference voltage on their gate.

5. Power-on-reset circuit according to claim 1, wherein the pull-up means comprises a diode transistor arranged in series with said switching transistor.

6. Power-on-reset circuit according to claim 1, wherein the current generator comprises:

a first branch comprising a first diode;

a second branch comprising a second diode arranged in series with a second precision resistance;

a third branch connected to the first precision resistance;

transistors arranged so that the three branches are traversed by an identical current; and transistors arranged so to that a voltage across terminals of a group formed by the second precision resistance and the second diode is equal to a voltage across terminals of the first diode.

7. Power-on-reset circuit according to claim 1, wherein the pull-down means comprises a pull-down transistor whose gate is polarized by the biasing signal, and wherein the biasing stage is designed to decrease a value of the biasing signal when the supply voltage reaches a predetermined value between said predetermined lower threshold voltage and said predetermined upper threshold voltage so as to reduce power consumption of the pull-down transistor.

8. Power-on-reset circuit according to claim 7, wherein the biasing stage comprises, arranged in series, a ballast transistor, a switch transistor whose gate is polarized by the supply voltage, and a diode transistor, the biasing signal being taken at a node between the ballast transistor and the switch transistor.

9. Power-on-reset circuit according to claim 1, comprising an output inverting gate whose input is connected to said output node and whose output delivers said power-on-reset pulse.

10. Integrated circuit, comprising a power-on-reset circuit according to claim 1 for generating said power-on-reset pulse when a supply voltage applied to said integrated circuit ramps up from zero to said predetermined voltage.

11. Microprocessor, comprising a power-on-reset circuit according to claim 1 for generating said power-on-reset pulse when a supply voltage applied to said microprocessor ramps up from zero to said predetermined voltage.

12. Power-on-reset circuit for generating a power-on-reset pulse when a supply voltage applied to said power-on-reset circuit ramps up from zero to a predetermined voltage, comprising:

pull-down means driven by a biasing signal for connecting an output node of the power-on-reset circuit to ground when the supply voltage reaches a predetermined lower threshold voltage; and pull-up means not driven by the biasing signal for connecting said output node to the supply voltage when the supply voltage reaches a predetermined upper threshold voltage, wherein the pull-up means comprises at least a switching transistor whose gate is polarized by a reference voltage, said reference voltage equal to a voltage across terminals of a first precision resistance traversed by a current delivered by a current generator, and wherein the current generator comprises:
  a first branch comprising a first diode;
  a second branch comprising a second diode arranged in series with a second precision resistance;
  a third branch connected to the first precision resistance;
  transistors arranged so that the three branches are traversed by an identical current; and
  transistors arranged so that a voltage across terminals of a group formed by the second precision resistance and the second diode is equal to a voltage across terminals of the first diode.

13. Power-on-reset circuit for generating a power-on-reset pulse when a supply voltage applied to said power-on-reset circuit ramps up from zero to a predetermined voltage, comprising:

pull-down means driven by a biasing signal for connecting an output node of the power-on-reset circuit to ground when the supply voltage reaches a predetermined lower threshold voltage; and pull-up means not driven by the biasing signal for connecting said output node to the supply voltage when the supply voltage reaches a predetermined upper threshold voltage, wherein the pull-up means comprises at least a switching transistor whose gate is polarized by a reference voltage, said reference voltage equal to a voltage across terminals of a first precision resistance traversed by a current delivered by a current generator, and wherein the biasing stage comprises, arranged in series, a ballast transistor, a switch transistor whose gate is polarized by the supply voltage, and a diode transistor, the biasing signal being taken at a node between the ballast transistor and the switch transistor.

\* \* \* \* \*

UNITED STATES PATENT AND TRADEMARK OFFICE
CERTIFICATE OF CORRECTION

PATENT NO. : 6,377,090 B1
DATED : April 23, 2002
INVENTOR(S) : Bruno Gailhard

It is certified that error appears in the above-identified patent and that said Letters Patent is hereby corrected as shown below:

Title page,
Item [75], Inventor: "Gailhard Bruno" should be changed to -- Bruno Gailhard --

Column 3,
Line 3, after "conventional" delete "is".

Column 6,
Line 43, after "S2" insert -- . --
Line 58, delete "(GNL)" and insert -- (GND) --.

Signed and Sealed this

Twenty-fifth Day of June, 2002

*Attest:*

*Attesting Officer*

JAMES E. ROGAN
*Director of the United States Patent and Trademark Office*